United States Patent [19]

Apgar et al.

[11] 4,394,602

[45] Jul. 19, 1983

[54] ENCLOSED ELECTRICAL DEVICES

[75] Inventors: Waldo D. Apgar, Reading; Charles L. Davis, Mohnton; Loring D. Emery, Jr., Hamburg; Werner F. Esseluhn, Wyomissing; Walter R. Holbrook, Reading, all of Pa.

[73] Assignees: Western Electric Co., Inc.; Bell Telephone Laboratories, Inc., both of New York, N.Y.

[21] Appl. No.: 324,757

[22] Filed: Nov. 25, 1981

[51] Int. Cl.³ .............................................. H01J 7/44
[52] U.S. Cl. ...................................... 315/71; 174/92; 337/242; 315/74
[58] Field of Search .................... 174/92; 337/242; 315/74, 71

[56] References Cited

U.S. PATENT DOCUMENTS

| | | | |
|---|---|---|---|
| 2,758,295 | 8/1956 | Sundt | 340/638 |
| 2,989,739 | 6/1961 | Wilson | 337/242 |
| 3,115,541 | 12/1963 | Hanner et al. | 174/92 |
| 3,319,030 | 5/1967 | Russenberger | 337/242 |
| 3,519,732 | 7/1970 | Grunbaum | 174/92 |
| 4,054,814 | 10/1977 | Fegley | 315/71 |
| 4,157,486 | 6/1979 | Fegley | 340/638 |

*Primary Examiner*—Harold A. Dixon
*Attorney, Agent, or Firm*—D. C. Watson

[57] ABSTRACT

An enclosed electrical device (42) includes an electrical circuit (50) having elements (48–68) which lie substantially in and along a plane (115). A member (70) is applied to a one side and a member (85) is applied to another side of the circuit (50) for at least partially enclosing the same. Conductors (48) and (49) of circuit (50) are fixedly penetrated, preferably by pins (74) which are fixedly engaged to enclosure members (70) and (85). Such engagement is advantageously provided by making the pins (74) an integral part of member (70), for example by including pins (74) in a premolded member (70). Such engagement is also advantageously provided by making pin-engaging sockets (94) an integral part of member (85), also for example by including the sockets (94) in a premolded member (85). By a preferred friction fit of pins (74) and sockets (94), the enclosure members (70) and (85) and circuit elements (48–68) are sufficiently fixed relative to one another to resist forces applied thereto in service.

20 Claims, 11 Drawing Figures

FIG.-5

FIG.-6 ly avoided such as, for example, filling the enclosure and adhering the members and elements together.

In view of the foregoing, it is desirable to provide new and improved enclosed electrical devices and methods of making such devices. It is preferred to make such devices by utilizing preformed enclosure members without filler materials and adhesives. It is further desirable to include partially enclosed devices requiring rugged retention of circuit elements such as slidebase, plug-in type devices.

ENCLOSED ELECTRICAL DEVICES

TECHNICAL FIELD

This invention relates to enclosed electrical devices and methods of making such devices. More particularly, the invention relates to at least partially enclosing such devices with insulative members which mechanically engage elements of a circuit in a secure assembly.

BACKGROUND OF THE INVENTION

Electrical devices typically include a circuit comprised of elements such as conductors, voltage or current limiters and sometimes a fuse and/or a lamp. Probably all such circuits have insulative restraints to maintain an internally secure arrangement of circuit elements. Most movable devices also have an external enclosure for ease in handling and to protect the circuit from the outside world. If a circuit includes features such as expendable fuses or an externally acting lamp or externally communicating contacts, an external enclosure may be more difficult to provide.

One example of a movable device having features which complicate an external enclosure is a slidebase, plug-in type device typical of those seen in telephone switchboards. Such devices often include a resistor and/or a fuse and usually a lamp which may be a light emitting diode (LED) encapsulated in a light transmissive lens cap with base. The LED is bonded to conductors which make external connection to an external circuit by laterally protruding, slidably engageable contacts, usually along two sides of the enclosure. A problem is to maintain an internally secure arrangement of the circuit elements against accidental forces applied to the lamp and expected forces applied to the contacts protruding from the external enclosure. A conventional solution has been to encapsulate as much of the circuit as practical in a unitary slidebase by molding an insulative material between and around the internal circuit elements. Such unitary encapsulation is especially helpful when devices are made in a lead frame structure to resist stresses in handling long lengths of lead frame and in separation of the devices therefrom.

The above technique provides suitable partially enclosed devices which are rugged in service and competitive in price. However, it has been found that the devices and methods of making the same have several disadvantages. For example, notches and holes are provided to secure conductors but encapsulating material usually requires pressure to flow therethrough for good encapsulation. Such pressure tends to force the lens cap from the lead frame and loosen the LED from the conductors. Also, material usage is wasteful in filling enclosures and labor is costly to remove flashings and for similar cleaning.

Efforts have been made to utilize preformed members of insulated material to enclose electrical devices. Typically, sensitive elements such as LEDs or integrated circuit (IC) chips are separately encapsulated. Then preformed members, conventionally molded from a thermosetting or thermoplastic material, are applied to either side of a circuit. An epoxy or phenolic type material is used to fill the interior and to adhere the preformed members to the circuit and to each other. To assure that complete encapsulation is made between and about all elements a heating step may be used to soften plastics or promote curing. While this technique may produce rugged devices, it has many steps which are

SUMMARY OF THE INVENTION

An enclosed electrical device according to the instant invention includes an electrical circuit lying substantially in and along a plane. A first member is applied to a first side and a second member to a second side of the circuit for at least partially enclosing the same. Elements in the circuit are fixedly penetrated, preferably by pins which are fixedly engaged to the enclosure members.

In a preferred embodiment, such engagement is advantageously provided in the first member by making the pins an integral part of said member, for example by including the pins in a premolding. Such engagement is also advantageously provided in the second member by making pin-engaging sockets an integral part of said member, also for example by including the sockets in a premolding. By a preferred friction fit of pins and sockets, the enclosure members and the circuit elements are sufficiently fixed relative to one another in a secure assembly to resist forces applied thereto in service.

BRIEF DESCRIPTION OF THE DRAWING

The invention will be more readily understood from the following detailed description thereof when read in conjunction with the accompanying drawing, wherein.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

Prior Art Devices

Figures 1, 2, 3A:
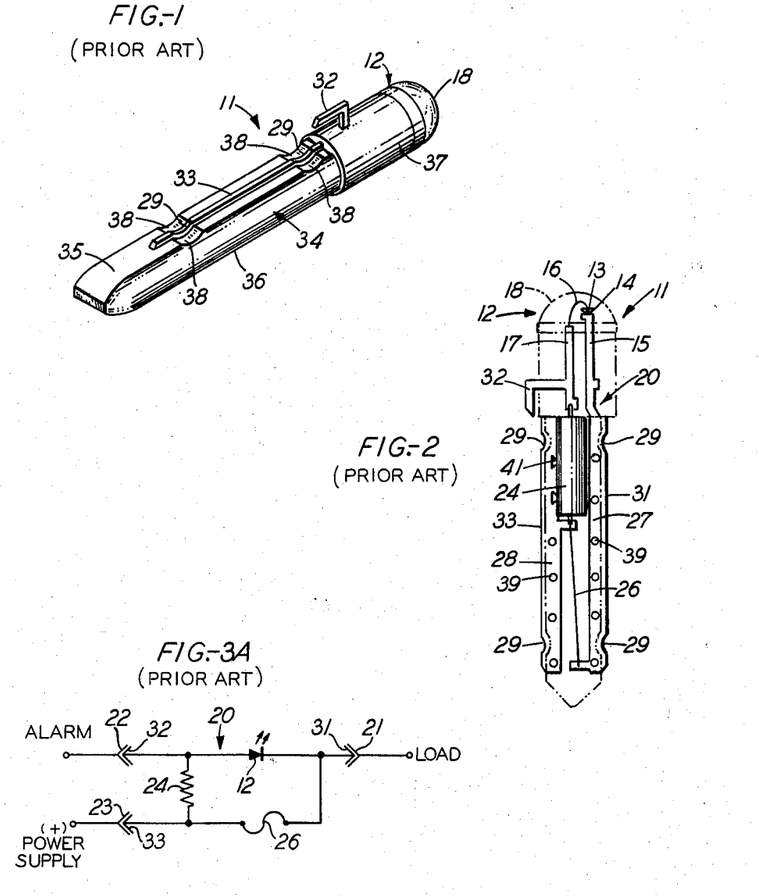
FIG. 1 is a pictorial view of a typical enclosed device made according to the prior art.
FIG. 2 is an elevation view of the device shown in FIG. 1 wherein part of the enclosure is shown in phantom outline to disclose internal features.
FIG. 3A is an electrical schematic of a prior art circuit for the device shown in FIGS. 1 and 2.

The advantages of the instant invention are best described with respect to a partially enclosed device of prior art design for rugged service conditions. FIG. 1 illustrates such a device 11 referred to in the trade as a slidebase, plug-in type adapted for socket mounting in a panel or by clip mounting in a fuse block (neither shown).

Device 11 contains a lamp 12 which may advantageously include a solid state, light emitting diode (LED) having long service life and consuming little power. FIG. 2 also illustrates device 11 outlined in phantom whereby its internal structure is readily examined. Device 11 will be described in detail even though it is denoted as prior art because many problems of device 11 are grounded in such detail. Also many elements of device 11 are similar to elements of the instant invention and may be given the same numerical designation without extensive discussion later.

Lamp 12 includes a diode formed in a chip 13 wherein one terminal is mounted to a reflector 14 preferably formed in one end of a header 15. The other terminal of the diode in chip 13 is bonded to a wire 16 which is further bonded to a lead 17. According to known steps, elements 13–17 are then encapsulated within a light transmissive, insulating lens cap 18 having a somewhat cylindrical base.

Device 11 may include a circuit 20 typical of that shown physically in FIG. 2 and schematically in FIG. 3A. A load at terminal 21 may be connected to an alarm at terminal 22 and a desired positive power supply at terminal 23. A resistor 24 diverts current through a fuse 26 until there is an overload condition; then when the fuse is destroyed, resistor 24 passes a limited current through the LED of lamp 12 to provide a visual indication of the condition. It is a challenging task to incorporate the elements of circuit 20 in a device 11 which is typically about 0.25 to 0.30 inches in diameter by about 1.5 to 1.7 inches long. It is further difficult to ruggedly enclose such a device while permitting the lamp 12 and circuit 20 to communicate with the outside world.

Relating the schematic of FIG. 3A to the physical circuit of FIG. 2, terminal 21 connects to a conductor 27 through an edge contact 31, terminal 22 connects to lead 17 through an arm contact 32 and terminal 23 connects to a conductor 28 through an edge contact 33. When device 11 is installed in a panel assembly (not shown), contacts 31 and 33 are slideably engageable with wall terminals 21 and 23, respectively, in a socket. When device 11 is installed in clips of a fuse block, the contact 32 is slideably insertable into a receptacle within the block. Contacts 31 and 33 contain a plurality of recesses 29, for engagement with and retention by detent members in a socket or a fuse block. Fuse 26 typically includes a fine silver wire which is strung between and soldered to a top flag part of conductor 28 and a bottom flag part of conductor 27. Resistor 24 is bondably connected to an extension of lead 17, and to the top flag part of conductor 28.

While device 11 is described primarily for circuit protection and monitoring service, it will be appreciated that it could also serve as a lamp alone with slight modification. For example, by eliminating alarm contact 32 and fuse 26, a device (not shown) with suitable current limiting resistor is made which may replace on a one-for-one basis, conventional telephone switchboard lamps.

It is readily seen in FIG. 2 that the elements of circuit 20 are disposed substantially in and along a plane to facilitate fabrication in a lead frame environment. Such disposition of elements should be substantially maintained against expected forces applied to contacts 31–33, accidental force applied to lamp 12 and stresses incurred within and in separation from a lead frame structure.

A conventional solution has been to encapsulate as much of circuit 20 as practical in a unitary slidebase 34 (FIG. 1) molded between and around the circuit elements while forming desired external features. For example, there are opposed, substantially flat surfaces 35 and 36 (only an edge of surface 36 is seen) which tend to prevent rotation of device 11 in a service socket. Surfaces 35 and 36 further include a plurality of recesses 38 formed therein for clearance of punch and dies in severing circuit 20 from a lead frame structure. At one end of slidebase 34 there are tapered surfaces to facilitate insertion into a socket and at the other end there is a cylindrical collar 37 molded about the base of lens cap 18. Such external features are formed integrally with and made a unitary part of slidebase 34.

By reference to FIG. 2 it can be seen that the elements of circuit 20 are closely spaced relative to one another, especially in the vicinity of resistor 24. Moreover, to properly embed each element in an encapsulation material, space is needed to allow pressure to equalize in a mold cavity by having material flow from side to side of the circuit and around each element. To facilitate the flow of material, a plurality of relatively large apertures 39 have been provided in conductors 28 and 27. Where such conductors are too narrow to accommodate apertures 39, for example at resistor 24, a plurality of notches 41 having reverse tapered sides are provided for encapsulation.

In the encapsulation of device 11 a free flowing epoxy was typically utilized which was applied at about 150° C. temperature and about 750 psig pressure in a multicavity transfer molding process. Care was exercised to have all lens caps 18 touch the end of each respective cavity or the pressure would extrude the lens cap 18 from the lead 17 and header 15 and dislodge chip 13 from reflector 14. Epoxy resins vary from batch to batch and sometimes the given temperature and pressure conditions did not cause the epoxy to flow well enough to fill all cavities. At other times the epoxy flowed so well that excessive material escaped along contacts 31–33 and lens cap 18 to cause excessive flashings which had to be manually removed. Consequently, while unitary encapsulation provided rugged devices 11, there were problems with costs, yields and sometimes reliability.

New And Improved Devices

Figure 4:
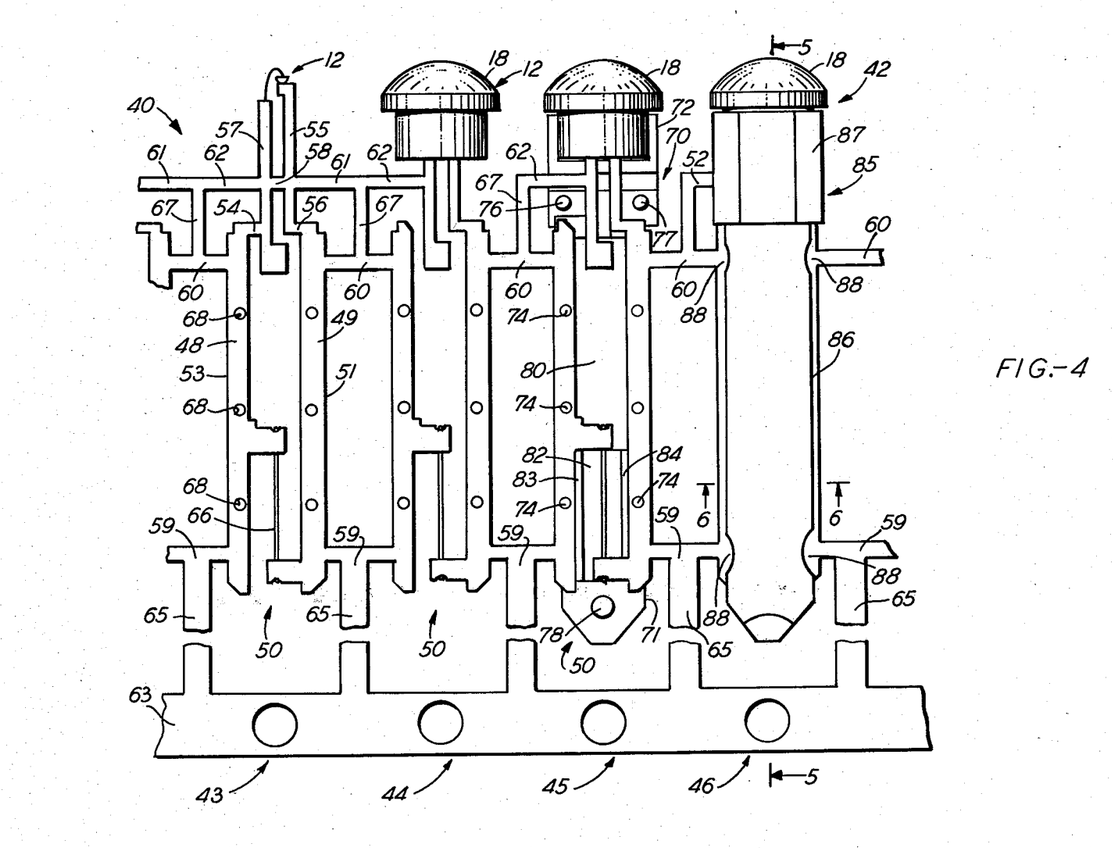
FIG. 4 is a plan view of a lead frame strip containing devices in various stages of assembly according to the instant invention.
Figure 5:
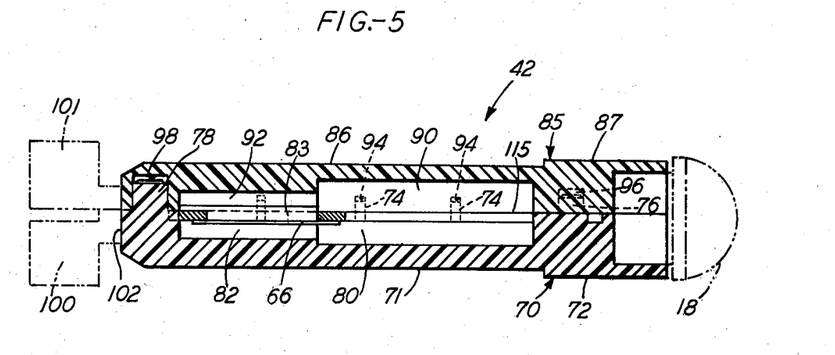
FIG. 5 is a sectional view of a completed device shown in FIG. 4, taken along line 5—5.
Figure 6:
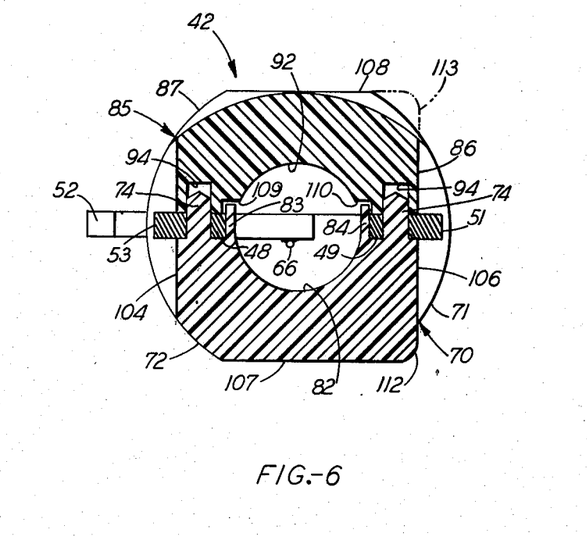
FIG. 6 is a sectional view of a completed device shown in FIG. 4, taken along line 6—6.

Many problems of the prior art are solved by devices of the instant invention made according to one or more methods illustrated in FIGS. 4–6. FIG. 4 shows a portion of a versatile lead frame strip 40 which is presently preferred in the manufacture of more than one device 42. Strip 40 typically includes about eighteen frames, designated for example as frames 43, 44, 45 and 46 in the strip 40 which is presently prepared about eight inches long for ease of handling. Normally, each frame in a strip 40 is processed together or in immediate succession; however, for illustrative purposes, frames 43-46 each show a device 42 in different stages of assembly.

Frame 43, for example, includes a pair of elongated, parallel portions 48 and 49 which will become conductors of a circuit 50 and provide edge contacts 53 and 51, respectively, equivalent to contacts 33 and 31 of device 11. Conductor 48 is connected by an optionally expendable lead frame portion 54 to a lead 57 and conductor 49 is connected to a header 55 by an optionally expendable portion 56 as will be explained later. Header 55 and lead 57 are substantially parallel to each other and held apart by an expendable portion 58. Header 55 and lead 57 support components similar to those of a lamp 12 as in device 11. A fuse 66 is installed between flags of conductors 48 and 49 much as was explained for the prior art device 11.

A plurality of frames such as 43-46 are supported in strip 40 by a plurality of support bars. For example, there are horizontal support bars 59 and 60, optionally expendable support bar portions 61 and 62, a plurality of tie bars 65 and 67 and a main support bar 63 which is perforated for ease of handling.

Such strips 40 of lead frame are typically cut from an electrically conductive sheet of a material such as copper-nickel-tin alloy which is then plated with corrosion resistant metals such as nickel and gold. The frames 43-46 are substantially planar and pliable enough that long strips can be rolled lengthwise without damage to the circuit portions.

By comparing FIG. 4 with FIG. 2 it can be seen that there are important differences in the conductors of each respective device 42 and 11. For example, the conductors 28 and 27 of device 11 typically had about ten apertures 39 formed therein about 0.040 inches in diameter to facilitate the flow of epoxy during encapsulation. Also there were at least two notches 41 formed therein near resistor 24 for the same purpose. It will be appreciated that such metal loss seriously weakened conductors 28 and 27 such that a void-free, unitary encapsulation was important to prevent contacts 31 and 33 from being displaced in service.

No such degree of metal loss is required in a device 42 made according to the instant invention. Conductors 48 and 49 are each penetrated by only three apertures 68 which may be about 0.034 to 0.038 inches in diameter. It has been found that by retaining the strength of the conductors a unitary encapsulation is not required to secure contacts 51 and 53 against forces expected in service. Instead device 42 may be enclosed and the elements secured mechanically by fixedly penetrating the conductors with pins as will be explained in more detail hereinafter.

Turning to frame 44 of strip 40 it can be seen that a lens cap 18 having a base has been molded about the components of lamp 12 as was explained for the prior art. At this point a decision is made to make a device 42 containing a circuit 50 having elements which can be explained by reference to FIGS. 3A and 3B. To avoid repetitive replacement, the resistor 24 is advantageously installed externally of circuit 20, for example in a fuse block, as illustratively depicted in FIG. 3B. The resulting circuit 50 functions in the same manner as circuit 20 and is powered by a positive supply from terminal 23 to contact 53. Alternatively, other circuits are advantageously made from lead frame strip 40, as will be explained later. Of course, when a new device replaces a device 11 in a prior art fuse block, resistor 24 may be installed in such device, preferably at frame 43, to acquire a circuit 20. On the other hand, to acquire a device 42 having a circuit 50 optionally expendable portions 54 and 61 and expendable portion 58 of frame 43 are removed to acquire the condition shown in frame 44 of FIG. 4. It is incidentally seen in frame 45 that retained frame portions 62 and 67 form an arm contact designated by the numeral 52 in frame 46. Such arm contact 52 is similar to arm contact 32 of device 11.

Frame 45 illustrates an assembly stage in which a first enclosure member 70 has been applied to device 42 in accordance with the instant invention. member 70 is preferably, although not necessarily, made of a glass filled nylon plastic by a separate injection molding process. The nylon plastic is selected because it is a tough, easily molded material with good dimensional stability which exhibits high strength in small members. It also has reasonably good lubricative and wear resistant surface qualities. A suitable material for the practice of the invention is sold by E. I. DuPont De Nemours Company of Wilmington, Del. under the trade designation "Formula 70G33L."

Member 70 includes a body portion 71 extending along and beyond conductors 48 and 49 and a collar portion 72 partially covering the base of lens cap 18. Member 70 further includes recesses such as channels and notches formed therein to accommodate circuit elements without crowding such elements against an external enclosure. There are also small pins 74 which penetrate the apertures 68 in conductors 48 and 49 to advantageously fix such conductors and the circuit elements attached thereto in their respective positions relative to one another. There are also large pins 76, 77 and 78 which do not penetrate circuit elements but which are strategically located to assist in securing member 70 to a second enclosure member 85 as will be explained later. It will incidentally be seen in FIGS. 5 and 6 that the various pins are chamfered about their ends to permit ease of engagement with their respective sockets.

Member 70 includes a deep trough portion 80 which accommodates optionally provided circuit elements such as a voltage dropping resistor used in switchboard lamps. There is also a shallow trough portion 82 which may accommodate a protective fuse 66 as shown in FIG. 4 or a zener diode in series with a resistor 24 for a special lamp. Trough 82 is advantageously bordered along two sides by walls 83 and 84 for purposes to be explained later.

Referring now to frame 46 in FIG. 4, a second enclosure member 85 has been applied to the top side of the circuit to complete the enclosure. Member 85 has a body portion 86 extending along and beyond conductors 48 and 49 and a collar portion 87 which completes the enclosure about the base of lens cap 18. It will incidentally be seen that, at a next stage of assembly, device 42 may be severed from strip 40 by removing support bars 59 and 60 from conductors 48 and 49. Accordingly, external recesses 88 are provided in both enclosure members 70 and 85 for this purpose (only recesses 88 in member 85 can be seen in FIG. 4).

FIG. 5 is a sectional view of the device 42 shown in FIG. 4, taken along line 5—5. It can be seen that member 85 has features complimentary to those of member 70. For example there is a deep trough portion 90 opposite trough 80, a shallow trough portion 92 opposite trough 82, small sockets 94 to fixedly engage the small penetrating pins 74, sockets 96 and 97 to receive large pins 76 and 77 (socket 97 is not shown) and a socket 98 to receive the large pin 78. It can also be seen in phantom outline that a plurality of members 70 are molded with an interconnective runner 100 and a plurality of members 85 are molded with an interconnective runner 101. In an illustrative example, six members 70 and six members 85, respectively, were molded interconnectively to runners 100 and 101. After members 70 and 85 are applied to the circuits in lead frame strip 40, the runners are broken off along a line 102 shown in FIG. 5.

FIG. 6 is a sectional view of device 42 shown in FIG. 4, taken along line 6—6. It can be seen that members 70 and 85 provide flat surfaces 104 and 106 along contacts 53 and 51, respectively, which are the equivalent of surfaces 35 and 36 shown on the prior art device 11 of FIG. 1. Also, the collar portions 72 and 87 of members 70 and 85, respectively, have flat portions 107 and 108 whereon labelling symbols may be imprinted. Member 85 has internal shoulder recesses 109 and 110 extending along and in alignment with walls 83 and 84, respectively, provided in member 70.

It is readily seen in FIG. 6 that the walls 83 and 84, associated with member 70, extend along and between the conductors 48 and 49, respectively, and the fuse 66. Further, when shoulder recesses 109 and 110, associated with member 85, are aligned to walls 83 and 84, respectively, they provide a conduit about the fuse 66. Consequently, when the fuse is destroyed, portions thereof are prevented from coupling across the circuit conductors 48 and 49 in an undetectable and, therefore, undesirable manner.

Referring to FIG. 3A, it can be seen that circuit 20 of device 11 is typically connected to a positive power supply by connection of contact 33 to external terminal 23. However, there are a number of applications where it is desirable to connect to a negative power supply at external terminal 23. If the prior art device 11 were installed as described previously but to a negative power supply, the lamp 12 would not emit light when fuse 26 is destroyed because the LED in chip 13 is electrically unidirectional. Consequently, it was previously necessary to turn chip 13 over and bond it with reverse polarity to header 15 to accommodate a negative power supply.

Figure 3B:
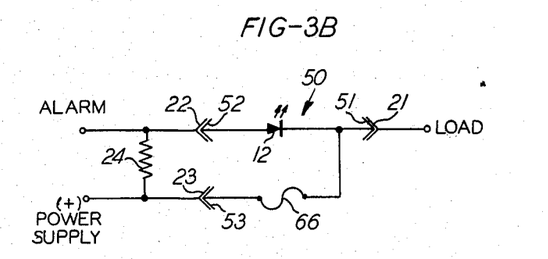
FIG. 3B is an electrical schematic of a circuit similar to that shown in FIG. 3A modified to suit the instant invention.
Figure 7:
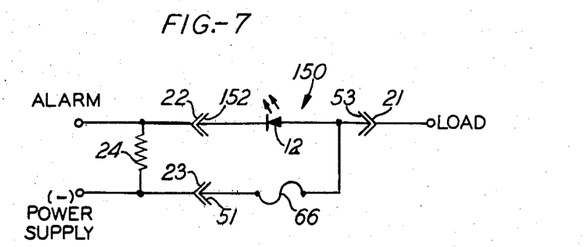
FIG. 7 is an electrical schematic of a circuit for a device connected to a negative power supply.

In the description of device 42, it was mentioned that resistor 24 is advantageously installed in the external circuit so it does not have to be replaced when a device 42 is replaced. Accordingly, circuit 50 is formed with only a lamp 12 and a fuse 66 in parallel legs of the circuit within a device 42 as shown in FIG. 3B. Therefore, conductors 48 and 49 and their respective contacts 53 and 51 can be reversed in service to suit the LED in lamp 12. By reference to frame 43 in FIG. 4, it can be seen that optionally expendable frame portions 54 and 61 can be retained and optionally expendable frame portions 56 and 62 can be removed. Then frame portions 61 and 67 will form an arm contact 152 (not shown) opposite to that of alarm contact 52 (frame 46). Now when such a device is removed from strip 40, it can be turned 180° about its elongate axis and be installed for reverse polarity service forming a novel device 142 according to a circuit 150 shown in FIG. 7.

A problem with the reversed device 142 is that it normally, externally looks exactly like a device 42. Therefore, to distinguish device 42 when applying enclosure members 70 and 85 to a circuit 50, the bottom member 70 is given a polarity indicating feature as shown in FIG. 6. There is included with member 70 a corner portion 112 extending for about 0.375 inches along the body portion 71. Of course, when a device 42 is removed from strip 40 the alarm contact 52 appears on the left of the device as shown. Also, contact 53 connects to terminal 23 of the external circuit and current flows through lamp 12 to the load at contact 51 connected to external terminal 21 as shown in FIG. 3B.

For negative power service in making a device 142, the top member 85 has a polarity indicating feature as shown in phantom in FIG. 6. There is included with member 85 a corner portion 113 extending along body portion 86 an equal distance to corner portion 112. Now when device 142 is turned 180° about its elongate axis for service, corner portion 113 appears at the lower left corner in FIG. 6 and device 142 is readily distinguishable from a device 42 even though all other external features are similar to those of a device 42.

It has been mentioned of the prior art that premolded members have been applied to circuits to enclose the same. However, when rugged contact pressures were expected it was conventional to cement the members together and to fill all voids to embed circuit elements in a secure assembly. No such filling and embedding is required in the instant invention. Of course the pins and sockets of members 70 and 85, respectively, could be cemented together to join the same. However, it has been found preferable to utilize a mechanically interfering fit between the pins and the sockets. For example, when pins 74 are made 0.036 inches in outside diameter, the complimentary sockets 94 are made 0.036 inches in inside diameter. It can be seen in FIGS. 5 and 6 that the sockets 94 are made sufficiently deep and the pins 74 are preferably made only so long that such pins do not touch the ends of the sockets. Consequently, when there is full engagement, there are frictional forces at work along the joining surfaces of pins 74 and sockets 94. Also, the conductors 48 and 49 are fully compressed between members 70 and 85 because pins 74 do not touch the ends of sockets 94 before the conductors are fully compressed. By a mechanically interfering fit, and especially with the preferred nylon enclosure material, the circuit elements become fixed relative to one another in a secure assembly. Moreover, it is often desirable, although not necessary to provide an interfering fit between the pins 74 and the apertures 68 in the conductors 48 and 49 to more fixedly engage these elements.

It will be appreciated that the large pins 76–78 and sockets 96–97 (FIGS. 4 and 5) are also provided to further secure the enclosure members 70 and 85 together. It will be further seen that the circuit elements are disposed to provide optimum location of these means for fixedly engaging the enclosure members. Initially it is observed that three points of engagement provide an advantageous method of minimizing warping stresses when engaging members along a common plane. The circuit elements of device 42 lie substantially in and along a common plane. This does not mean that all elements lie exactly in the plane but only that such elements lie near a common plane as is best seen in FIG. 5. Note that member 70 has recesses to permit the circuit elements to be set below an interface 115 between members 70 and 85 and such interface is substantially planar. Consequently, by engaging members 70 and 85 at three major points along the planar interface 115 warping stresses are minimized.

As best seen in FIG. 4, pins 76 and 77 are set on either side of the substantially parallel elements 57 and 55. Consequently, when the collar portions 72 and 87 of members 70 and 85 are snapped over the base portion of lens 18, there are symmetrical forces applied thereto. Such symmetrical pins 76 and 77, in cooperation with the large pin 78, provide an advantageous feature of device 42 which will now be explained.

A preferred device 42 is achieved by utilizing an enclosure material having reasonably lubricative surface qualities and by utilizing a mechanical interference fit of the pins and sockets. Accordingly, the pins for fixedly penetrating the circuit elements and the sockets for fixedly engaging the pins are adapted to facilitate disassembly and reassembly of the enclosure. A preferred method of gaining access to the internal circuit after initial assembly and without substantial damage to device 42 is shown in FIG. 8.

Figure 8:
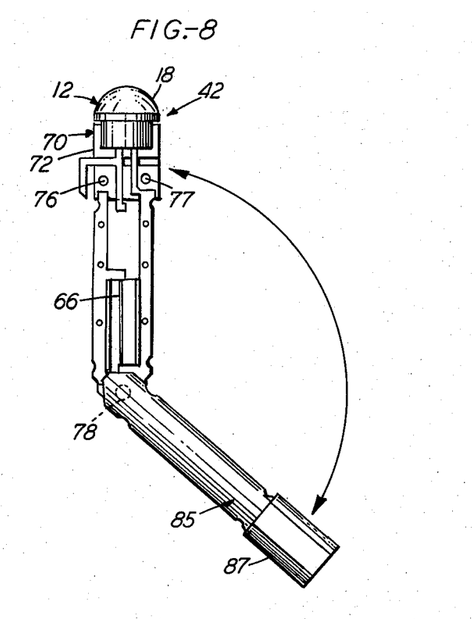
FIG. 8 is a pictorial view of a completed device shown in FIG. 4 wherein an enclosure member is pivotally disassembled to permit access to a circuit member.

The members 70 and 85 are pried apart at collar portions 72 and 87, respectively, until pins 76 and 77 are, respectively, free from sockets 96 and 97 (not seen in FIG. 8). The member 85 is turned out of alignment with member 70 by about 120 to 135 degrees for maximum access to the circuit. When an element is repaired or replaced, member 85 is again pivoted about pin 78 and applied upon the circuit to complete the collar about the base of lamp 12.

General Considerations

It will be noted that devices 42 and 142 are designed for simplicity, economy of manufacture and ruggedness. The same lead frame strip 40 and lamp 12 can be utilized to make many different colored switchboard lamps by merely changing color of lens cap 18 or the material of chip 13 or both. Also, by adding fuse 66 and varying the expendable portions removed from strip 40, many types of fuse devices with protective features, visual indicators and contact connection to external, audible alarms may be manufactured.

Figure 9:
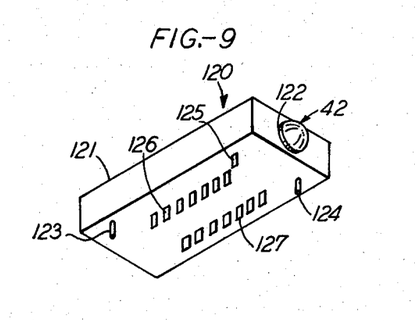
FIG. 9 is a pictorial view of a fuse block designed as a dual-in-line package (DIP).

In a further embodiment of the invention a device 42 (or 142) may be installed in a dual-in-line package (DIP) designated generally by the numeral 120 and shown in FIG. 9. DIP 120 includes a fuse block 121 having a socket 122 wherein there is shown a device 42. Internal circuitry of DIP 120 connects to a plurality of insertion pins 123-127 including alignment pins 123 and 124, on offset pin 125, for connection to an alarm circuit and dual-in-line pins 126-127. DIP 120 may be readily inserted into an assembly such as a printed circuit board and provide a desirable circuit 130 as shown schematically in FIG. 10.

Figure 10:
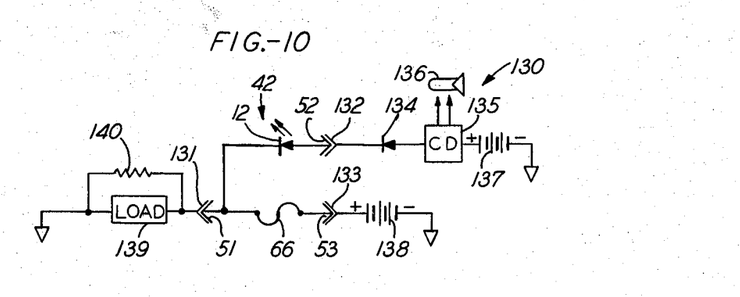
FIG. 10 is an electrical schematic of a circuit associated with the DIP shown in FIG. 9.

It can be seen in FIG. 3A or 3B that a circuit 20 or 50, respectively, may be vulnerable to an unstable load condition. Accordingly, when a fuse is destroyed a resistor which couples LED 12 to a power supply may pass more current than the LED 12 can tolerate. To provide for such condition, circuit 130 includes a separate power supply for the alarm leg. Contact 52 connects to terminal 132 and, therefore, to a bias blocking diode 134, a current detector 135 which operates alarm 136 and to a power supply 137. Contact 53 connects to terminal 133 on the positive side of power supply 138 and contact 51 connects to terminal 131 and a load 139 in parallel with a bleed resistor 140 to ground.

The supply voltage from 138 is higher than the alarm voltage from 137 so LED 12 is normally reverse biased in the OFF condition and diode 134 keeps high voltage out of the alarm circuit. When fuse 66 is destroyed the supply voltage is removed and the alarm voltage puts LED 12 in a forward bias condition so the light is ON as shown. The current detector 135 operates alarm 136 and either the load 139 or bleed resistor 140 completes the alarm circuit to ground. For negative voltage supplies (not shown), a contact 152 of a device 142 connects to terminal 132, contact 53 connects to terminal 131 and contact 51 connects to terminal 133.

The invention has been described utilizing enclosures made of a thermoplastic such as glass filled nylon. Yet many other thermoplastics may be used with advantage because they are amenable to injection molding of members such as members 70 and 85 and the scrap is reusable. If desired, the thermoplastic members may be cemented or ultrasonically fused together, especially after initial assembly, disassembly and reassembly to replace circuit elements. Although it is preferred to make pins 74 and 76-78 a part of member 70, such pins may be separately made and applied to elements and sockets in both members 70 and 85.

It will be appreciated that snap fitting enclosure members over a circuit is less hostile to circuit elements than the prior art method of encapsulation with heat and pressure. Even filling cavity enclosures with materials such as epoxies can be injurious because of temperatures developed in curing adhesives. It has been noted that many circuit elements are made of metals having good conductive properties which metals are also corrosion resistant. Consequently, it is advantageous to avoid unitary encapsulation for corrosion or for hermitic sealing with attendant device stresses when an enclosed circuit can wear well at generally ambient conditions.

The invention permits a class of lamps and two classes of fuses to be made with interchangeable enclosure members. Consequently, the number of molds are minimized, they are simplified and the molding can be done off the production line. Nevertheless, the invention is not limited to the enclosure members shown and described for devices 42 and 142. For example, separate members could be utilized to form the collar about the base of lamp 12 or the collar could be eliminated in a fuse device without a lamp 12.

Unless used with different explanatory modifiers, the term "circuit" used in this application shall carry the meaning set forth in Webster's Seventh new Collegiate Dictionary, page 150, as ". . . 4b: an assemblage of electronic elements . . . " It is believed, and will therefore be assumed, that one of ordinary skill in these arts would include *electrical* elements in this definition. This meaning essentially agrees with page 1, lines 9-11 of this application wherein typical circuit elements are recited to include conductors, voltage or current limiters and sometimes a fuse and/or a lamp. It is likewise assumed that one of ordinary skill would include electronic items such as diodes and transistors in circuit elements.

There have been illustrated herein certain embodiments of the invention and certain applications thereof. Nevertheless, it is to be understood that various modifications and refinements may be made and used which differ from these disclosed embodiments without departing from the spirit and scope of the present invention.

What is claimed is:

1. An enclosed electrical device, comprising:
    an arrangement of circuit elements including conductive elements lying substantially in and along a plane;
    a first enclosure member applied to a first side and a second, separate enclosure member applied to a second side of the circuit elements for at least partially enclosing said circuit elements; means in one or more conductive elements for permitting penetration of such elements;

means for penetrating conductive elements in the circuit for fixedly restraining such elements; and means associated with said enclosure members for fixedly engaging the penetrating means such that the enclosure members and the circuit elements are fixed relative to one another in a secure assembly.

2. A device as in claim 1, wherein the fixedly penetrating means include one or more pins affixed to the first enclosure member and the fixedly engaging means include sockets at least in the second enclosure member, and wherein there is further provided:

a mechanically interfering fit between the pins and the sockets of sufficient strength that the circuit elements and the enclosure are securely assembled by frictional engagement of the pins in the sockets.

3. A device as in claim 2, further comprising:

recesses formed in the enclosure members for receiving therein circuit elements such that said enclosure members are contacted to one another and to any desired circuit elements substantially along a planar interface; and means disposed at three points along the planar interface for further fixedly engaging the enclosure members.

4. A device as in claim 2, wherein the circuit elements include a destructible fuse element located proximate electrical conductors and the enclosure members further comprise:

walls associated with the first member extending along and between the fuse and the conductors; and means aligned to the walls and associated with the second member for forming a conduit about said fuse element such that when the element is destroyed, portions thereof are prevented from coupling across said circuit conductors.

5. A device as in claim 4, wherein at one end the circuit includes a lamp with a base and wherein the enclosing members form a collar about said base, the lamp being exposed to view.

6. A device as in claim 4, wherein the fixedly penetrating means and the fixedly engaging means are adapted to facilitate disassembly and reassembly of the enclosure, thereby permitting access to the circuit after initial assembly without substantial damage to the device.

7. A device as in claim 6, wherein the first member partially forms a collar about the base of the lamp during assembly and wherein there is a pivot pin in said first member opposite the lamp, further comprising:

a corresponding socket in the second member for application to and pivoting about the pivot pin, said member being optionally out of alignment with the circuit and then being turned into alignment with and fully applied upon the circuit elements completing the collar about the base of the lamp.

8. A device as in claim 6, wherein the enclosure members are premolded of a suitable insulating material.

9. A device as in claim 6, wherein the enclosed circuit elements are generally at ambient pressure.

10. A device as in claim 6, wherein electrical contacts protrude laterally from the elements and the enclosure, said contacts and said enclosure being adapted to facilitate slidebase, plug-in operation of the device.

11. A device as in claim 10, wherein the enclosure is formed at least partially with a distinctive body shape indicating a circuit characteristic such that the device is substantially keyed to means for receiving the device adapted to the body shape and the circuit characteristic.

12. A plurality of electrical devices, comprising:

a succession of individual arrays of circuit elements formed in a lead frame structure and lying substantially in and along a common plane;

a first enclosure member applied to a first side and a second, separate enclosure member applied to a second side of each array for at least partially forming an enclosure about each respective array of circuit elements;

a succession of means for penetrating conductive elements in each respective array of circuit elements for fixedly restraining said elements; and each enclosure containing means for fixedly engaging the means penetrating elements in its respective array of circuit elements such that the enclosure members and the circuit elements of each respective circuit are fixed relative to one another in a secure assembly and the devices are fixed relative to one another in the lead frame.

13. A method of making an enclosed electrical device, comprising:

forming an arrangement of circuit elements lying substantially in and along a plane; such elements including conductive elements, applying a first member to a first side and a second, separate member to a second side of the circuit elements to at least partially form an enclosure about said circuit elements, including: forming the conductive elements with means along lateral surfaces thereof for permitting penetration of such elements, and penetrating conductive elements in the circuit with means fixedly engageable with the elements and the enclosure members; and fixedly engaging the penetrating means to the enclosure members such that said members and the circuit elements are fixed relative to one another in a secure assembly.

14. A method as in claim 13, wherein fixedly penetrating includes inserting into conductive elements in the circuit one or more pins affixed to the first member, and wherein fixedly engaging includes aligning sockets in the second member with said pins, further comprising:

compressing the pins and sockets together in a mechanically interfering fit of sufficient strength that the circuit elements and the enclosure are securely assembled by frictional engagement of the pins in the sockets.

15. A method as in claim 14, wherein forming the circuit elements includes installing a destructible fuse element located proximate electrical conductors and wherein applying the enclosure members further comprises:

disposing walls associated with the first member along and between the fuse and the conductors; and aligning to said walls means associated with the second member for forming a conduit about said fuse element such that when the element is destroyed, portions thereof are prevented from coupling across said circuit conductors.

16. A method as in claim 15, wherein forming the circuit elements includes, at one end of the arrangement circuit elements, installing a lamp with a base and wherein applying the enclosure members includes forming a collar about said base, the lamp being exposed to view.

17. A method as in claim 14, wherein fixedly penetrating and fixedly engaging includes adapting the enclosure members to facilitate disassembly and reassembly thereof, thereby permitting access to the circuit after initial assembly without substantial damage to the device.

18. A device as in claim 14, wherein the enclosure members are premolded of a suitable insulating material and wherein the enclosed circuit elements are generally at ambient pressure.

19. A method of making a plurality of electrical devices, comprising:
    forming in a strip having a succession of lead frames, a succession of individual arrays of circuit elements, at least each array in its respective frame lying substantially in and along a plane;
    applying a first member to one side and a second, separate member to the other side of each array for at least partially enclosing each respective circuit, including:
        penetrating conductive elements in each respective circuit with means fixedly engageable to the elements and to the respective enclosure members; and fixedly engaging the penetrating means to the respective enclosure members such that said members and said circuit elements of each respective array are fixed relative to one another in a secure assembly and the devices are fixed relative to one another in the lead frame.

20. A method as in claim 19, wherein forming the succession of arrays of circuit elements in a lead frame structure further comprises:
    forming at least one element in an array which element is electrically unidirectional in function as desired in a respective device;
    forming in the frame associated with said unidirectional element at least two optionally expendable portions which are alternative in nature such that when one expendable portion is removed the device is oriented in a first direction for service and when the alternate expendable portion is removed the device is oriented in a second direction for service; and
    selecting and removing the optionally expendable portion corresponding to the orientation desired for the respective device in service.

* * * * *

UNITED STATES PATENT AND TRADEMARK OFFICE
CERTIFICATE OF CORRECTION

PATENT NO. : 4,394,602

DATED : July 19, 1983

INVENTOR(S) : W. D. Apgar, C. L. Davis, L. D. Emery, Jr., W. F. Esseluhn, W. R. Holbrook It is certified that error appears in the above—identified patent and that said Letters Patent is hereby corrected as shown below:

Column 4, line 8, "force" should read --forces--.
Column 6, line 11, "member" should read --Member--.
Column 9, line 42, "on" should read --an--. In the claims, Column 10, claim 1, line 68, "means" should begin a new element. Column 11, claim 10, line 64, after "the" (first occurrence) insert --circuit--. Column 12, claim 12, line 16, "each" should begin a new element. Column 12, claim 13, line 26, "plane; such elements including conductive elements," should read --plane, such elements including conductive elements;--. Column 12, claim 13, line 31, "forming" should begin a sub-element. Column 12, claim 16, line 67, after "arrangement" insert --of--.

Signed and Sealed this

Twenty-fifth Day of October 1983

[SEAL]

Attest:

GERALD J. MOSSINGHOFF

Attesting Officer      Commissioner of Patents and Trademarks